United States Patent [19]

Kleyer

[11] Patent Number: 4,979,468
[45] Date of Patent: Dec. 25, 1990

[54] INSTALLATION FOR THE EVAPORATION OF METALS

[75] Inventor: Siegfried Kleyer, Hainburg, Fed. Rep. of Germany

[73] Assignee: Leybold Aktiengesellschaft, Hanau I, Fed. Rep. of Germany

[21] Appl. No.: 217,940

[22] Filed: Jul. 12, 1988

[30] Foreign Application Priority Data

May 24, 1988 [DE] Fed. Rep. of Germany ....... 3817513

[51] Int. Cl.$^5$ ............................................. C23C 16/00
[52] U.S. Cl. .................................. 118/726; 118/718; 392/386
[58] Field of Search ................ 118/726, 718; 219/271, 219/273, 275, 276

[56] References Cited

U.S. PATENT DOCUMENTS

| 3,581,529 | 6/1971 | Mitchell | 219/271 |
| 4,163,038 | 7/1979 | Nishimura et al. | 219/275 |
| 4,787,333 | 11/1988 | Kamino et al. | 118/726 |

FOREIGN PATENT DOCUMENTS

| 747257 | 9/1944 | Fed. Rep. of Germany . |
| 2548357 | 5/1983 | Fed. Rep. of Germany . |
| 255422 | 2/1949 | Switzerland . |

OTHER PUBLICATIONS

Frenzelit brochure, "Information—Quality Materials for Thermal Insulation and Sealing" (date not available).

Primary Examiner—Norman Morgenstern
Assistant Examiner—Terry J. Owens
Attorney, Agent, or Firm—Felfe & Lynch

[57] ABSTRACT

An apparatus for coating both sides of strips in a vacuum with zinc includes a casing which encloses a coating chamber and a winding chamber, a removable cover disposed on at least one side of the casing for pressure-tight sealing the coating and winding chambers, a winding assembly having rotatably supported deflecting rollers, guide rollers, tensioning rollers, and coating drums and a take-off and a take-up roll and evaporating sources disposed in the coating chamber. These evaporating sources are provided with a nozzle lip 60 including two L-shaped profile ledges 63 which are parallel to one another and kept in a spaced-apart relationship by means of tranversely disposed spacing screws 65 and adjusting nuts 66. The width of the nozzle gap 67 formed by the two profile ledges 63 can be changed by turning the adjusting nuts 66 on the spacing screws 65. The nozzle lip is spaced by a slot (S) from a frame part. An elastic sealing member rests firmly against the inner wall of the frame part in the slot and thereby closes the slot.

5 Claims, 4 Drawing Sheets

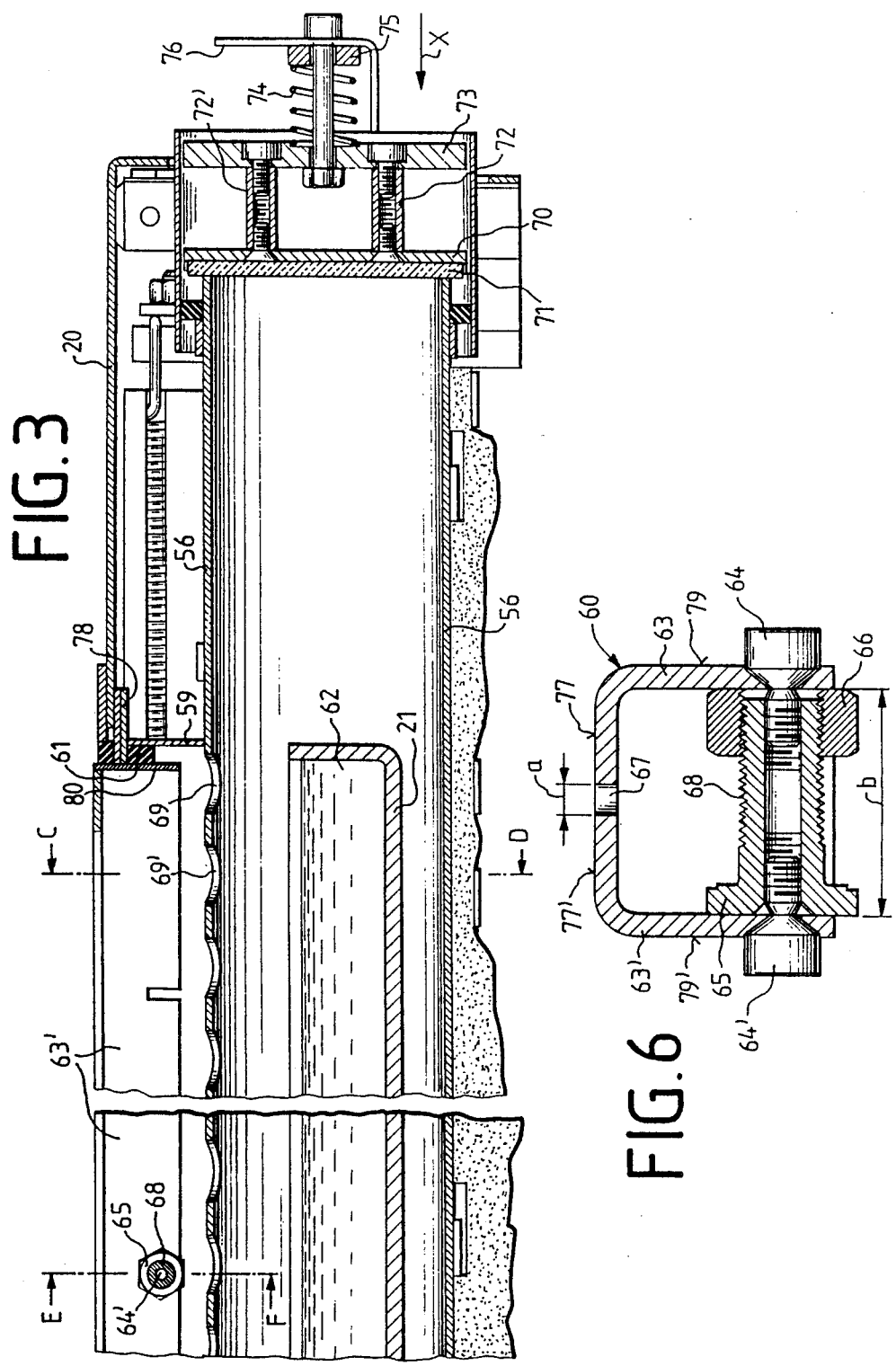

INSTALLATION FOR THE EVAPORATION OF METALS

The invention relates to an installation for the evaporation of metals, especially for coating substrates in vacuum, with a source of evaporation for the working material to be evaporated, with a profile body which receives an evaporation vessel and encloses it partly, with an inner tube, which provides openings preferably at its upper side, with a heating aggregate disposed at the outer side of the inner tube, and a nozzle ledge provided above the inner tube.

For installations for the evaporation of metals for coating strips it is known to provide a nozzle lip above the evaporation vessel, which is composed of a metal profile which is ripped open lengthwise. The opening in the nozzle, formed by the rip is supposed to make sure, that the evaporated metal emerging out of the evaporation shuttle settles evenly onto the strip running past directly in front of the opening of the nozzle or onto the film to be coated. However, since the temperatures in the area of the opening of the nozzle are high, it has been experienced that the known nozzle lip tends to be deformed during the coating process, which causes an alteration of the form of the opening of the nozzle. An unevenly shaped opening of the nozzle, respectively an uneven slot of the nozzle cannot carry out an even settlement onto the tape or the film, so that as a result the quality of the coating obtained is unsatisfying.

Therefore the invention relates to the object, to provide an installation for evaporation of metals, the nozzle lip of which provides a slit, which is adjustable, or the width of which can easily be readjusted. Besides the nozzle lip should be quickly exchangeable and resistant to extreme temperatures. Furthermore the nozzle lip should be simple and rugged in this construction and thus be easy to clean. Finally the installation and especially the locking devices of the evaporation source should be hermetically closable, that is in such a way, that an unintentional "welding" to the inner tube or jamming with the locking part cannot occur.

This task is resolved pursuant to the invention by the fact, that the inner tube is firmly connected with the frame part, which encloses the openings, the nozzle lip being embraced by an elastic sealing frame, which rests against the inner wall of the frame part, and which thus closes the slot between the nozzle lip and the frame part.

In the event that the inner tube or the frame part, which is firmly connected to it, or the nozzle lip should be distorted under the effect of the high temperature during the coating process, or if it changes its form, this change is fully compensated by the sealing frame, which is made up of an elastic and highly heat resistant material known to those skilled in the art.

Preferably the nozzle lip is formed by two L-shaped curved profile ledges, the two arms of which form together a nozzle opening in the form of a slot and extend in a horizontal plane, facing each other, and the two other arms, extend in parallel, vertical planes and are held in a distance to each other by several distance bolts with adjusting nuts, which are disposed distributed over the length of the profile ledges Advantageously the arm of a profile ledge extending in a vertical plane is screwed together with a first screw to the end of the pin with thread of the distance bolt, the other arm of the other profile ledge resting at the front face of an adjusting nut, which is screwed together with the pin with thread of the distant bolt. In the event that the nozzle slot should have been deformed in its width or shape during the coating process, an adjustment can be carried out over the distance bolts, with the adjustment nuts belonging to them.

Suitably the screws, which connect the arms of the two profile ledges, extending in a vertical plane, project by their screw heads over the arms of the profile ledges towards the outside and rest with the screw heads against the lower side of the elastic sealing frame, which surrounds the nozzle lip, thus fixing the nozzle lip against sliding in vertical direction.

In addition to this the heads of the outer screws, which connect the profile ledges with the spacing screws, have cylindrically shaped heads, comprising an inner polygonal socket, so that they rest elastically against the sealing frame in each of the process in the same way.

Preferably the two L-shaped, curved profile ledges, which are held parallel to each other, are connected at their two ends over cross pieces at front plates, which sit on the upper side of the box-type designed frame-part with lugs, extending towards the outside. Thus the two profile ledges form together with the cross-wise disposed front plates one box-type designed integral part, which can be mounted and disassembled easily after the cover piece of the housing of the evaporation source is removed.

In order to be able to seal off the inner tube after inserting or drawing out the evaporation vessel, the opening at the front side of the inner tube can be closed by a locking plate, the locking plate being pressed by a pressure spring against the annular front face of the inner tube and the end of the pressure spring, which is turned away from the locking plate sitting on a stationary bearing, for example on a bar, which rests against lugs or arms of the evaporation source.

The invention allows very different examples of embodiment; one is represented schematically in more details in the enclosed figures:

FIG. 1 shows a top view of a part of a strip-coating-installation, the winding device for the load-process of which is driven out of the coating chamber, which is fashioned as a hollow cylinder, FIG. 2 shows the front view of the installation pursuant to FIG. 1, that is in a cross-section according to the lines A—B pursuant to the FIG. 1; some of the guide and tensioning rollers are not represented in more details, in order to provide a better overview, FIG. 3 shows a partial/longitudinal section through an evaporation source as built into the strip-coating-installation pursuant to the FIGS. 1 and 2, the inner tube with the base not being represented in more details, for more clarity.

FIG. 6 shows a cross-section of the nozzle-ledge of the evaporation installation pursuant to the FIG. 3, according to the lines E—F, in an enlarged scale.

Figure 2:
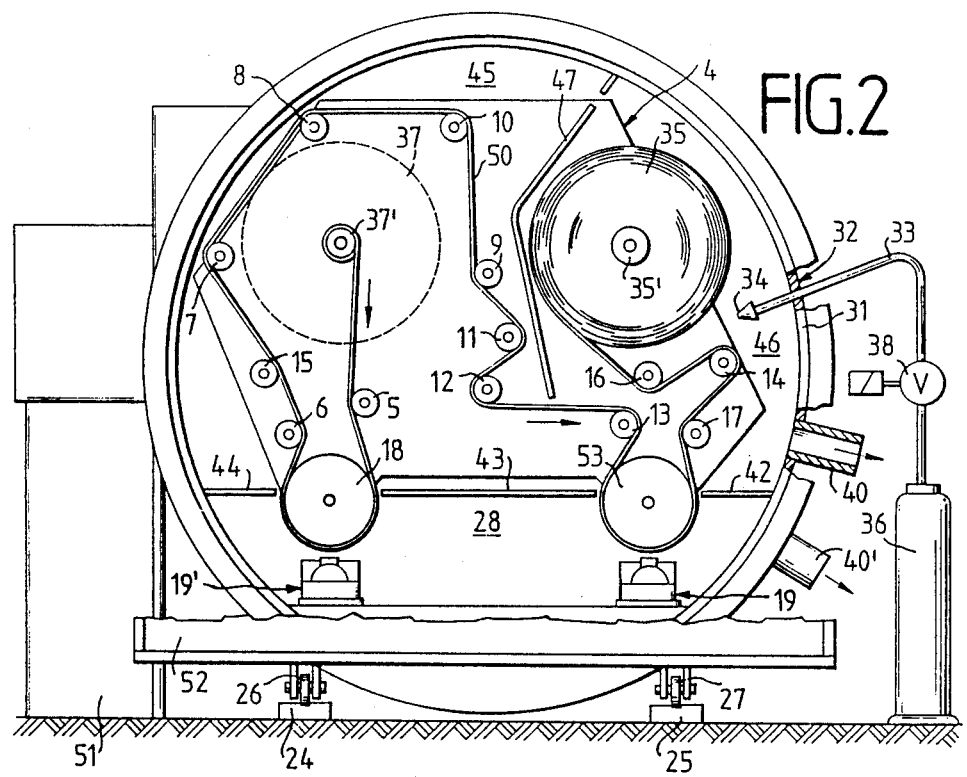
Figure 1:
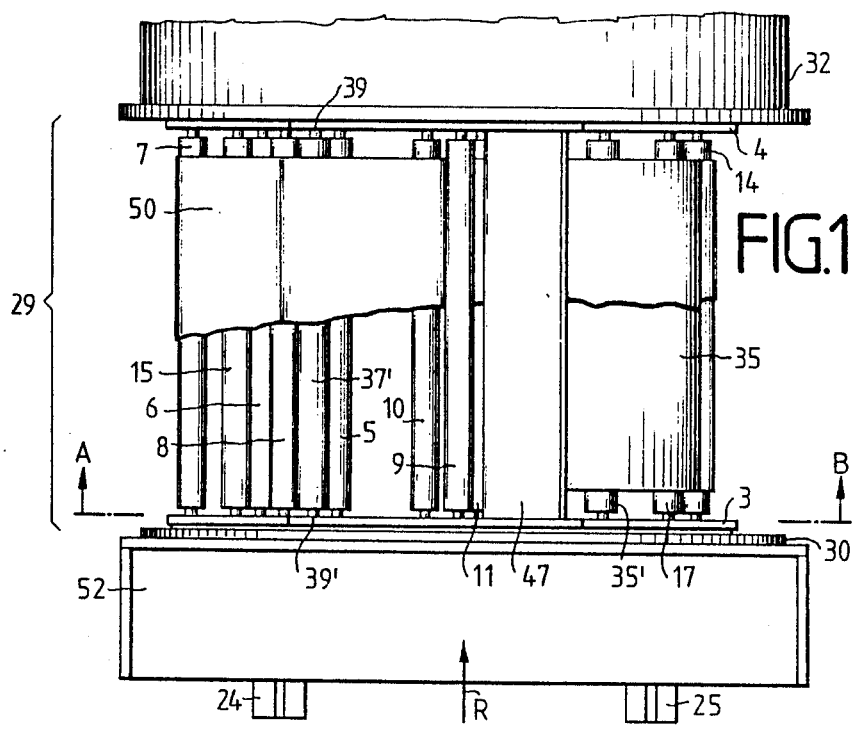

The strip-coating-installation is basically composed of the guide, tension measuring, pulling and tensioning rollers 5 through 17, disposed between the two plate bars 3, 4, and the cooled coating rollers 18, 53, the wind-off roller (37) and the take-up roller 35 and the evaporation sources 19, 19', disposed in the coating chamber 28, which is formed by a hollow cylinder 32, with evaporation shuttle. The two plate bars 3, 4, attached to the supporting frame 52 can be driven into or out of the winding chamber 45 over rollers 26 27 on runway rails 24, 25, together with the rollers 5–17 and the coating-rollers 18, 53, which form the winding-device 29 in direction of arrow R.

When the winding device 29 is driven in, the disk-shaped cover 30, which is disposed stationary at the supporting frame 52, rests against the flange-formed front face 31 of the hollow cylinder 32 and is fixed there at the hollow cylinder 32 by clamps which are not shown in more details, respectively is pulled by the atmospheric pressure against the front side 31, by reason of the under-pressure provided in the winding chamber 45 or in the coating chamber 28 during the phase of operation.

Besides the strip-coating installation provides a tube-conduit 33, the end on the side of the installation of which provides a nozzle, the tube conduit being connected to a gas-container 36 and being lead through the wall of the hollow-cylindrical housing 32 in the area of the taking-up roller 35. A valve 38 is inserted into the tube conduit, over which the through-flow of a gas through the tube conduit 33, or its outlet over the nozzle 34 can be adjusted.

For starting the operation of the tape-coating-installation first a wind-off roller 37 or its wind-off roller 37' are hung into the bearing eyes 39, 39' at the plate bars 3, 4, and the tape to be coated is lead over the rollers 5–17 or over the coating-rollers 18, 53 up to the winding-up roller 35' and is attached to it. Eventually the entire winding-installation 29 can be inserted into the hollow-cylindrical housing 32 in the direction of the arrow R, as far until the cover 30 rests sealing against the front face 31. After arresting the supporting frame 52 in its operating position, the chamber 28, 45 can be exhausted of air over the suction pump connections 40, 40'. After having reached a predetermined operative pressure, the heating aggregates 41 of the evaporation sources 19, 19' . . . can be activated, so that evaporated metal emerges out of the evaporation vessels (for example zinc), and so that it can settle onto the winding path 50 in the area of the cooled coating rollers 18, 53. At the same time different rollers and especially the winding-up roller 35' are put into rotation by motors, which are not represented in more details, so that the strip runs down from the wind-off roller 37', passes the evaporation sources 19 and 54, and runs up to the take-up roller 35' and in the course of this it is coated on both sides. In order to avoid adhesion of the different layers of the winding path 50 on the take-up 35, a gas, for example nitrogen is blown over a nozzle 34 after the valve 38 is opened onto the winding-path 50. The proper coating-chamber 28 is separated from the part of the installation, in which the strip is transported, taken off and wound up—or on again, by means of plates 42, 43, 44.

Figure 4:
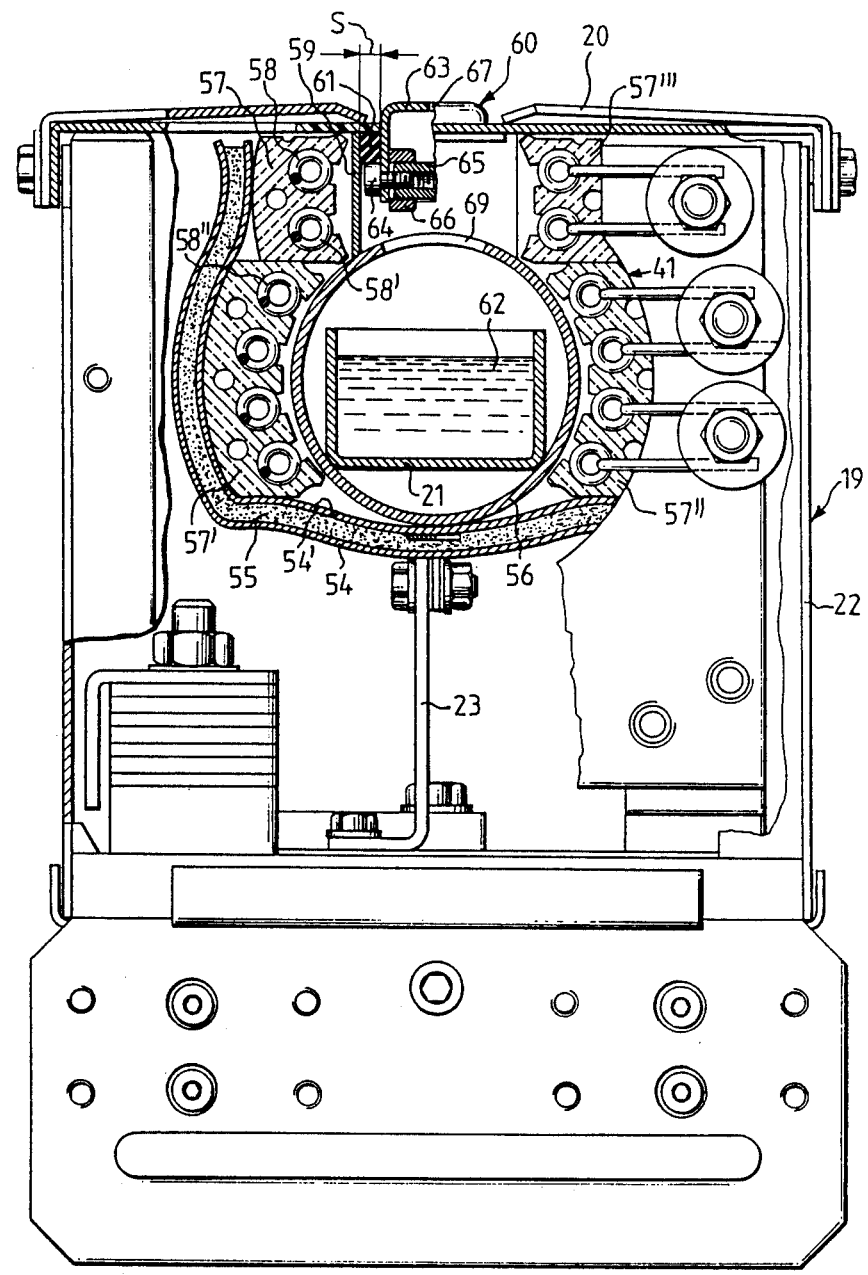
FIG. 4 shows the cross-section of the evaporation installation pursuant to the lines C—D according to FIG. 3.

In addition to this the described functioning can be controlled and manipulated from a switch cabinet 51. The evaporation source 19, shown in an enlarged scale and in a cross-section in FIG. 4, provides a housing 22 with a cover part 20 and a double-walled hollow-profile 54, 54', which is held in the housing 22 by a support 23, the hollow profile providing a U-shaped cross-section, an insulating mass 55 being filled into the hollow space, which is formed by the two profile walls, and the evaporation source provides four insulating bodies 57, 57', 57'', 57''' with their heating spirals 58, 58', which are disposed distributed around the inner tube 56, a frame part 59 being firmly disposed at the inner tube 56, a nozzle lip 60 which is inserted into the frame-part 59 from above and which comprises an elastic sealing frame 61, and finally an evaporation vessel 21 with the fused metal mass 62 to be evaporated.

The inner tube 56 provides a number of openings 69, 69' disposed behind each other, through which the metal vapor can flow up to the nozzle lip 60.

As shown in FIG. 6 in an enlarged scale the nozzle lip 60 is composed of two L-shaped, curved profile-ledges 63, 63', the parallel lateral parts of which provide borings, disposed in a distance from each other, through which the screws 64, 64' are passed through, the screws being screwed together in pairs with a spacing screw respectively. Each spacing screw 65 is connected to an adjustment nut 66, the front side of which rests against the inner side of the L-shaped profile-ledge 63 respectively. The distance 'a', which the horizontal arms 77, 77' of the profile ledges 63, 63' provide from each other, forms a nozzle opening 67, which by modification of the distance 'b' can be adjusted.

So if for example it is stated, that the desired value 'a' of the nozzle opening 67 has increased, the desired value 'a' can be obtained again, by opening or closing the adjustment nuts 66, 66' . . . accordingly to the respective pin with thread 68, 68' . . . of the spacing screws 65, 65' belonging to them. The two L-shaped profile-ledges 63, 63' are connected firmly to each other at their two front-ends by front plates 80, 80', the sealing frame sitting on the one side sealing against the inner wall of the face wall of the frame piece 59 of the inner tube 56.

Figure 5:
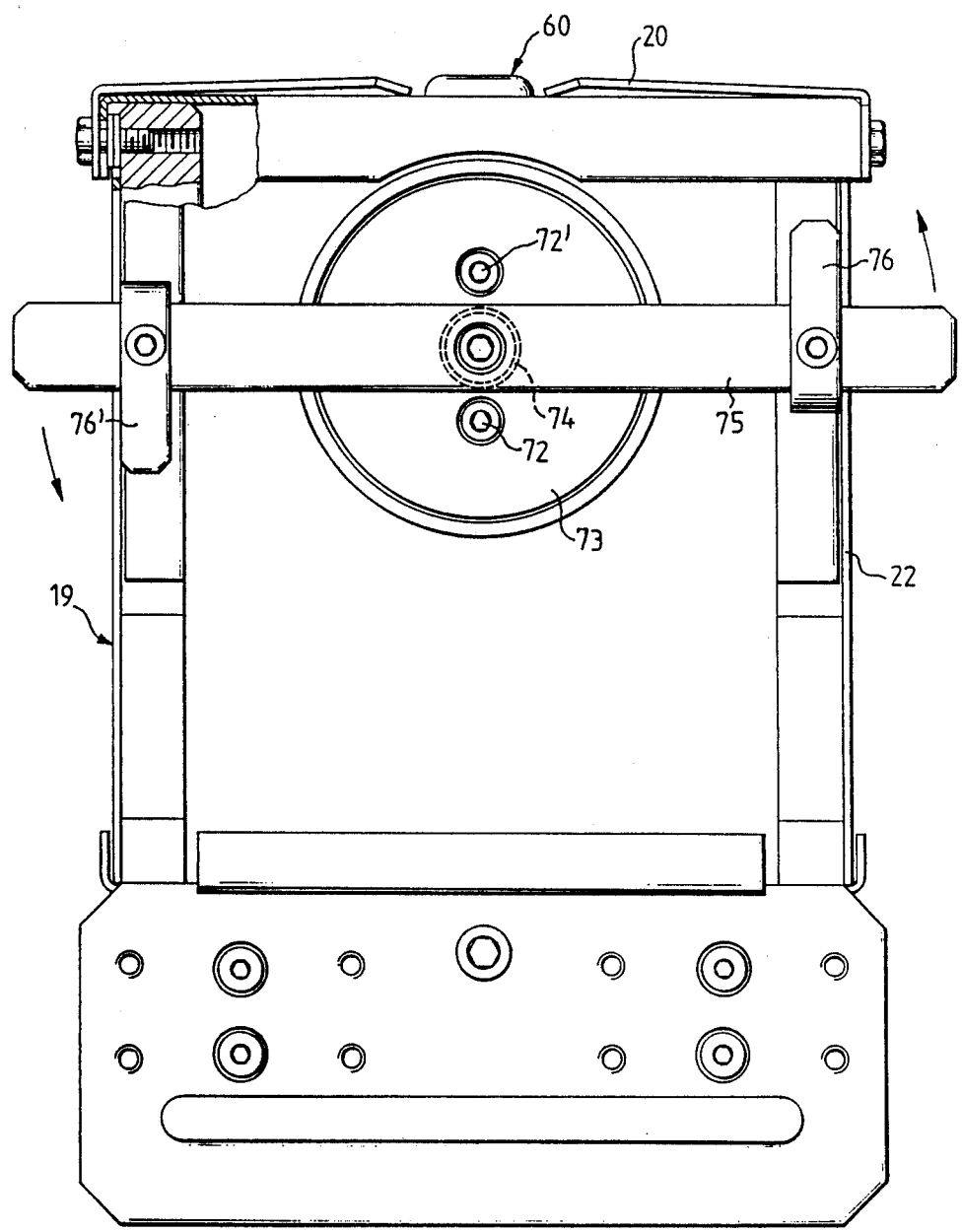
FIG. 5 shows the view x of the front side of the evaporation installation pursuant to the FIG. 3

The ends of the inner tube 56 are closed respectively by a locking plate 70, providing an insulating layer 71, the locking plate being pressed over spacing bolts 72, 72' against the annular front face of the inner tube 56. The spacing bolts are screwed together with a front plate 73, which sits over a pressure spring 74 on a bar 75, which is held by two arms 76, 76', which are firmly connected to the housing 22. In order to open the inner tube 56, the bar 75 is turned in the direction of the arrow (FIG. 5) and thus the insulating layer 71 of the locking plate is released.

I claim:
1. In apparatus for evaporating metals for coating substrates in a vacuum, an evaporation source of the working material to be evaporated, comprising:
a body including an inner tube having an upper opening and including outside the inner tube means for heating the inner tube and including above the inner tube a nozzle lip;
an evaporation vessel displaceable in said inner tube for containing the metal to be evaporated;
a frame part;
said inner tube having an upper region connected with said frame part, said nozzle lip being spaced by a slot (S) from said frame part; and
an elastic sealing member which rests firmly against the inner wall of said frame part in said slot and thereby closes said slot;
said nozzle lip including two L-shaped, curved ledges having two arms facing each other and extending in a horizontal plane, and forming a slit-shaped nozzle opening and having two other arms which are parallel to each other and extend in vertical planes and are held at a distance (b) with respect to each other and in which spacing screws with ad- justment nuts are disposed distributed over the length of said profile ledges for holding said two other arms at said distance (b) with respect to each other.

2. An evaporation source in accordance with claim 1, which includes a first spacing screw having an end, in which one arm of one of said ledges extending in a vertical plane is screwed to said end of said spacing screw, and which includes a first screw for screwing said one ledge to said spacing screw, and in which the other arm of the other profile ledge which extends in a parallel vertical plane is screwed to another part of said first spacing screw, and which includes a second screw for screwing said other ledge to said first spacing screw, and which includes a first adjustment nut having a front side and which is screwed together with said first spacing screw, the other arm of said one profile ledge resting against said front side of said first adjustment nut.

3. An evaporation source in accordance with claim 2, in which said screws which screw said arms of said two profile ledges extending in said vertical planes to said first spacing screw and said first adjustment nut, project by screw heads over arms of said profile ledges and lie with said screw heads against a lower side of said elastic sealing member and thus fix said nozzle lip against being slid upwardly in vertical direction.

4. An evaporation source in accordance with claim 3, which includes front plates and in which said two L-shaped curved, ledges, which are held at said distance (b) with respect to each other by said first spacing screw with said first adjustment nut, are connected to each other by two ends over said front plates, which sit with lugs on said frame part.

5. An evaporation source in accordance with claim 4, which includes a locking plate and an open end of said inner tube and in which said open end is closed by means of said locking plate, and which includes an insulating layer disposed between a said inner tube and said locking plate, and which includes a pressure spring for pressing said locking plate against said inner tube.

* * * * *

UNITED STATES PATENT AND TRADEMARK OFFICE
CERTIFICATE OF CORRECTION

PATENT NO. : 4,979,468
DATED : December 25, 1990
INVENTOR(S) : Siegfried Kleyer It is certified that error appears in the above-identified patent and that said Letters Patent is hereby corrected as shown below:

Column 2, line 17 for "each of the" read

-- each phase of the --.

Signed and Sealed this

Twenty-first Day of December, 1993

Attest:

BRUCE LEHMAN

*Attesting Officer*   *Commissioner of Patents and Trademarks*